United States Patent [19]

Yamazaki et al.

[11] 4,065,315

[45] Dec. 27, 1977

[54] PHOTOTROPIC DYE SYSTEM AND PHOTOSENSITIVE COMPOSITIONS CONTAINING THE SAME

[75] Inventors: Toshio Yamazaki, Mission Viejo; Harriet J. Cook, Los Alamitos; Melvin A. Lipson, Fullerton, all of Calif.

[73] Assignee: Dynachem Corporation, Tustin, Calif.

[21] Appl. No.: 680,304

[22] Filed: Apr. 26, 1976

[51] Int. Cl.$^2$ .................. G03C 5/24; G03C 1/52; G03C 1/68

[52] U.S. Cl. .................. 96/48 QP; 96/90 R; 96/115 P; 96/67; 96/86 P; 96/85; 96/87 R

[58] Field of Search .............. 96/90 R, 90 PC, 115 P, 96/85, 86 P, 87 R, 48 QP, 48 R, 67

[56] References Cited

U.S. PATENT DOCUMENTS

| | | | |
|---|---|---|---|
| 3,102,029 | 8/1963 | Fichter et al. | 96/90 R |
| 3,342,603 | 9/1967 | Sprague et al. | 96/90 R |
| 3,361,563 | 1/1968 | Hackmann et al. | 96/90 R |
| 3,370,026 | 2/1968 | Patella et al. | 96/90 R |
| 3,443,945 | 5/1969 | Fichter | 96/90 R |
| 3,712,817 | 1/1973 | Hazy | 96/90 R |
| 3,899,338 | 8/1975 | Lewis | 96/115 P |
| 3,926,643 | 12/1975 | Chang | 96/115 P |

FOREIGN PATENT DOCUMENTS

| | | | |
|---|---|---|---|
| 957,192 | 5/1964 | United Kingdom | 96/90 R |

*Primary Examiner*—Won H. Louie, Jr.
*Attorney, Agent, or Firm*—Stanley A. Marcus

[57] ABSTRACT

The free bases of various amino dyestuffs, such as the amino derivatives of triarylmethane and xanthene dyestuffs form stable solutions with organic halides and a matrix, such as a film-forming binder. Dry films of such compositions are lightly colored; upon exposure to actinic light, the dyestuffs become intensely colored. The combination of dyestuff free base and organic halide is particularly useful in conjunction with photopolymerizable compositions to denote the polymerized portions of a dry film photoresist and to enable the use of thicker films or coatings of liquid photopolymerizable compositions than were previously useful.

29 Claims, No Drawings

PHOTOTROPIC DYE SYSTEM AND PHOTOSENSITIVE COMPOSITIONS CONTAINING THE SAME

BACKGROUND

In the manufacture of printed circuit boards by the subtractive process, to illustrate a technique widely used at the present time, there is adhered to the surface of a copper-clad laminate one surface of a photopolymerizable film; the other surface of the film is adhered to a film support. The photopolymerizable layer is thereafter exposed to light according to a predetermined pattern, the support is removed and the copper layer exposed by washing away the unexposed areas of the photopolymerizable layer. The exposed copper layer is then etched away by chemical milling.

In the additive process, to describe another useful technique, there is adhered to the surface of a laminate substrate (which may or may not be copper-clad) one surface of a dry, photopolymerizable film; the other surface is adhered to a film support. The photopolymerizable layer is thereafter exposed to a predetermined light pattern, the support is removed and the substrate exposed by washing away the unexposed areas of the photopolymerizable layer. At this point, the substrate is treated with appropriate sensitizers and metallizing solutions, whereby a layer of metal, usually copper, is applied to the substrate.

The dry, photoresist films are typically fairly light in color, and the substrates with which they are used, in the processes illustrated above, are typically copper-clad laminated boards. In this circumstance, it is extremely difficult to inspect the product after exposure to light and prior to removal of the unexposed areas of the layer to insure that the light mask has been properly placed, and to be sure that there are no imperfections or defects in the exposed photopolymerizable layer. It would be extremely useful to have a dry photoresist film which visually indicates where the film has been exposed to light so that detection of defects can readily be made prior to developing the film and etching the copper-clad panels or building up a layer of metal on the exposed substrate.

Liquid photopolymerizable compositions are becoming more and more widely used to replace conventional lacquers, inks, varnishes and paints which all use volatile solvents that contribute substantially to atmospheric pollution. The use of liquid photopolymerizable materials presents a problem, however, particularly when colored systems are employed. Simply stated, the more intense the color, the thinner is the coating that can be used, since the coloration inhibits the penetration of actinic light through the coating. It would be extremely useful to have a liquid photopolymerizable system that is colorless or lightly colored in the unexposed state and which both crosslinks and becomes intensely colored upon exposure to actinic light.

DESCRIPTION OF THE PRIOR ART

U.S. Pat. No. 3,042,515 to Eugene Wainer which issued July 3, 1962, discloses the combination of a plastic binder or film former, an arylamine and an organic halide which produces free radicals on exposure to light. The colorless arylamine reacts with the halogen free radicals to produce a colored reaction product.

The problem which attends the practice of the invention described in U.S. Pat. No. 3,042,515 is that the compositions are not stable in solution, a proposition noted by the inventor himself. This instability was recognized by J. George Fidelman in U.S. Pat. No. 3,114,635. Fidelman discloses the same kind of a system as Wainer, solving the problem of instability by withholding the major portion of the organic halide from the photosensitive composition; the halide is provided in a separate sheet which is placed in contact with the photosensitive composition as an overlay just prior to exposure. Yamada, et al deal with the problem of stability in their U.S. Pat. No. 3,544,320, by adding peroxides, perchlorates or perborates while Fotland, in U.S. Pat. No. 3,560,211 treats his films to remove molecular oxygen.

U.S. Pat. Nos. 3,113,024 and 3,121,632 to Sprague, et al. disclose imaging systems based on leuco triphenylmethane dyes and a sulfonyl or sulfenyl halide in the former patent and an alkyl or aryl ketone in the latter patent. As will be seen, the leuco dyestuffs are not stable.

In U.S. Pat. No. 3,495,987, there is disclosed a photopolymerizable composition containing a bromine containing compound and a cyanine dye sensitizer for said bromine compound. In this case, the dye does not change color but, rather, functions to sensitize the photopolymerizable composition to red and green light, i.e., causes the bromine containing compound to release bromine free radicals upon exposure to light of various wavelengths.

U.S. Pat. No. 3,769,023 discloses the combination of a hydroxy alkyl cellulose binder, an N-vinyl monomer, a photosensitive free-radical generator and a color former, including the leuco dyes which have been found to be unstable. The patentee teaches that use of the normally liquid acrylate and methacrylate monomers is not preferred in that use of these monomers in an oxygen-containing atmosphere drastically slows the photographic speed.

In Thommes, et al U.S. Pat. No. 3,418,118, there are disclosed photopolymerizable compositions that provide continuous tone images in color. Here, it is a dye that is sensitized by light that induces generation of free radicals by a free radical producing agent.

In U.S. Pat. No. 3,255,006, there is disclosed the combination of a photopolymerizable composition with a fluorescent dye. The quality of fluorescence changes upon exposure to actinic light.

SUMMARY OF THE INVENTION

It has now been found that the free base of ketone imine dyestuff; or of an amino derivative of a triarylmethane dyestuff; or an amino derivative of a xanthene dyestuff; or an amino derivative of an acridine dyestuff; or a methine or polymethine dyestuff forms a stable phototropic system in the presence of an organic halide which liberates halogen free radicals on exposure to actinic light, a free-radical initiated addition-polymerizable, ethylenically unsaturated monomer and a photoinitiator for said monomer. In one aspect, the invention relates to the discovery that the exposure pattern of a photoresist film can readily be determined by incorporating a phototropic dye system comprising an organic halide which liberates halogen free radicals on exposure to actinic light and the free base of a dyestuff as described above in a dry, photoresist film. The dye system darkens or changes color to visually indicate where the photoresist film has been exposed to actinic light.

In one embodiment of this aspect of the invention, there is provided a stable photopolymerizable composition comprising:

a. an addition polymerizable ethylenically unsaturated compound having at least one terminal ethylenic group attached to a carbon atom of said compound, having a boiling point above 100° C at normal atmospheric pressure and being capable of forming a high polymer by free-radical initiated addition polymerization;

b. a free-radical generating addition polymerization initiator activatable by actinic radiation;

c. the free base of a dyestuff whose halide salt is more intensely colored than the free base; and d. a halogen containing compound that releases halide free radicals upon exposure to actinic light.

In the preferred embodiments, the photopolymerizable composition contains an acrylyl or methacrylyl compound or derivative thereof, the initiator includes an acyloin ether, an alkyl-substituted anthraquinone, benzophenone or an alkylaminobenzophenone; the dyestuff is the free base of an amino triarylmethane or amino xanthene dye and the halogen containing compound is the normally solid amide of a halogenated aliphatic carboxylic acid.

Another embodiment of the invention relates to a dry photoimagable composition as described in the form of a thin layer and especially to an assembly comprising a support sheet, a layer of a dry photoimagable composition as described, one surface of which is adhered to the support sheet and a transparent sheet adhered to the other surface of said composition.

In another embodiment, the invention relates to a photopolymerizable composition as described on a support. In one aspect of this embodiment, the support is a conductive metal layer, one surface of which can be in contact with a coextensive surface of an insulating layer.

In yet another aspect, the invention relates to the discovery that solvent-free liquid, actinic radiation-curable coating or printing compositions which comprise:

a. an addition polymerizable ethylenically unsaturated compound having at least one terminal ethylenic group attached to a carbon atom of said compound, having a boiling point above 100° C at normal atmospheric pressure and being capable of forming a high polymer of free-radical initiated addition polymerization;

b. a free-radical generating addition polymerization initiator activatable by actinic radiation;

c. the free base of a dyestuff whose halide salt is more intensely colored than the free base; and d. a halogen containing compound that releases halide free radicals upon exposure to actinic light can be applied in substantially thicker cross sections than is now the case to provide colored, fully cured products.

DETAILED DESCRIPTION

As indicated above, the invention involves a stable photopolymerizable composition comprising:

a. an addition polymerizable ethylenically unsaturated compound having at least one terminal ethylenic group attached to a carbon atom of said compound, having a boiling point above 100° C at normal atmospheric pressure and being capable of forming a high polymer by free-radical initiated addition polymerization;

b. a free-radical generating addition polymerization initiator activatable by actinic radiation;

c. the free base of a dyestuff whose halide salt is more intensely colored than the free base; and d. a halogen containing compound that releases halide free radicals upon exposure to actinic light.

This combination devolves from the discovery that the free base of a dyestuff, more particularly the free base of a. a ketone imine dyestuff
b. an amino derivative of a triarylmethane dye
c. an amino derivative of a xanthene dye
d. an amino derivative of an acridine dye
e. a methine or polymethine dye and a halogen containing compound that releases halide free radicals upon exposure to actinic light, forms a stable phototropic system in the presence of an addition polymerizable ethylenically unsaturated compound capable of forming a high polymer by free-radical initiated addition polymerization and a photoinitiator that generates free-radicals under the influence of actinic radiation. The free base of the dyestuff must be less intensely colored than the halide salt of the dyestuff.

The term "phototropic" as used herein is intended to identify the capacity of a system, such as the subject dyestuff free base-halide system, to darken in response to actinic light; the term is derived from "photo"-indicating light or radiant energy and "tropic"-changing or tending to change in a specified manner in response to a specified stimulus.

As ketone imine dyestuffs, there can be used the free bases of Auramine O and Auramine G, C.I. 41000B and 41005.

The amino triarylmethane dyestuffs whose free bases can be used, can be generally represented by the formula

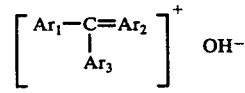

Where $Ar_1$, $Ar_2$ and $Ar_3$ are carbocyclic aryl groups that are unsubstituted or substituted by one to three of:

lower alkyl, lower alkoxy, lower acyl, carboxyl, carboloweralkoxy, sulfo, including the alkali, alkaline earth metal and amonium salts thereof, nitro, halo, hydroxyl and amino of formula

where R' and R" each independently is hydrogen, lower alkyl, phenylloweralkylene, phenyl, sulfoloweralkylene, lower acyl, naphthyl, and where said phenyl and naphthyl groups are optionally substituted by one to three of nitro, sulfo, hydroxyl, lower alkoxy, lower alkyl, amino, sulfamyl, carboxyl, carbamyl, phenylimino and halogen and provided that at least one of $Ar_1$, $Ar_2$ and $Ar_3$ contains at least one amino group of formula

and where $Ar_3$ can additionally be indolyl that is optionally substituted.

The triarylmethane dyes whose free bases are or particular interest herein can be more specifically represented by the following formula:

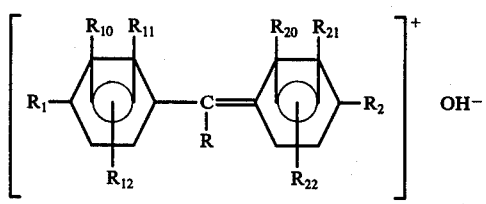

where R is carbocyclic or heterocyclic aryl of formula

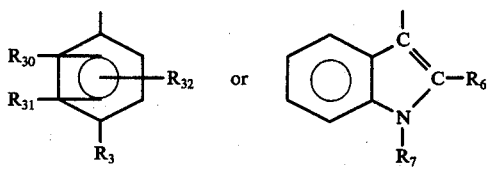

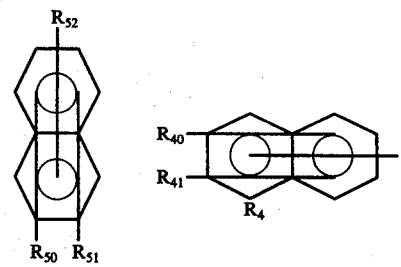

where $R_1$, $R_2$, $R_3$ and $R_4$ each independently is hydrogen, hydroxyl, or amino of formula

where R' and R" each independently is hydrogen, lower alkyl, lower acyl, sulfoloweralkylene, phenylloweralkylene, phenyl or naphthyl, said phenyl or said naphthyl groups being unsubstituted or substituted by one to three of nitro, sulfo, hydroxyl, lower alkoxy, lower alkyl, amino, sulfamyl, carbamyl, carboxyl, lower acyl, carboloweralkoxy, halogen or phenylimino where said phenyl group may be substituted as described;
and where at least one of $R_1$, $R_2$, $R_3$ and $R_4$ is amino of formula

and $R_{10}$, $R_{11}$, $R_{12}$, $R_{20}$, $R_{21}$, $R_{22}$, $R_{30}$, $R_{31}$, $R_{32}$, $R_{40}$, $R_{41}$, $R_{42}$, $R_{50}$, $R_{51}$, and $R_{52}$, each independently is hydrogen, lower alkyl, hydroxyl, carboxyl, sulfo including the amonium, alkali or alkaline earth metal salt thereof, nitro, halo, phenylazo, loweralkoxy, lower acyl, carboloweralkoxy, or amino of formula

where R' and R" are as previously defined and $R_6$ is lower alkyl or phenyl and $R_7$ is hydrogen or lower alkyl.

The free bases of triarylmethane dyestuffs of the following formula are a preferred class of dyes

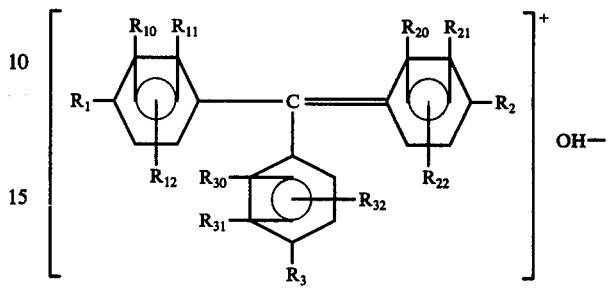

where the substituents are all as previously defined.

Within the family of dyes described by the formula immediately preceding, preferred are those where $R_1$, $R_2$ and $R_3$ are hydrogen or

where R' and R" each independently is hydrogen, alkyl of one to four carbonatoms, benzyl, phenyl, sulfoethylene and where said phenyl and benzyl are unsubstituted or substituted in the aromatic moiety by one to three of nitro, sulfo, hydroxyl, alkyl of one to four carbonatoms, alkoxy of one to four carbonatoms, amino or chloro.

Of the dyes set out immediately above, particularly preferred are those where $R_1$ and $R_2$ are

and $R_3$ is hydrogen, sodium sulfo or

and where R' and R" each is hydrogen, methyl, ethyl, phenyl or sodium sulfo phenyl.

Especially preferred are the free bases of the dyestuffs having the formula

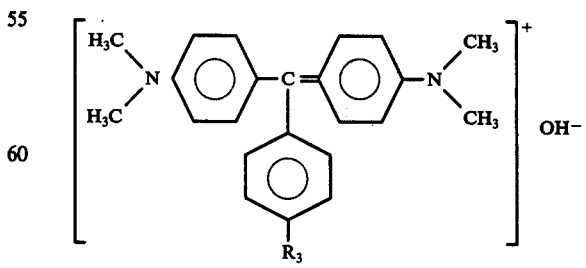

where $R_3$ is hydrogen or dimethyl amino.

The xanthene dyestuffs, whose free bases are useful herein, can be represented by the general formula:

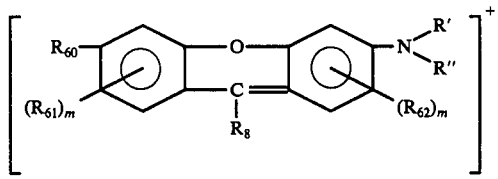

where $R_8$ is hydrogen or optionally substituted carbocyclic aryl $R_{60}$ is oxo, lower alkoxy, hydroxyl or

where R' and R" are as previously defined;
m is an integer from one to three and
$R_{61}$ and $R_{62}$ are selected from the same group as $R_{10}$ and when m is two or three, the substituents can be the same or different.

A preferred group of xanthene dyestuffs are represented by the following structural formula:

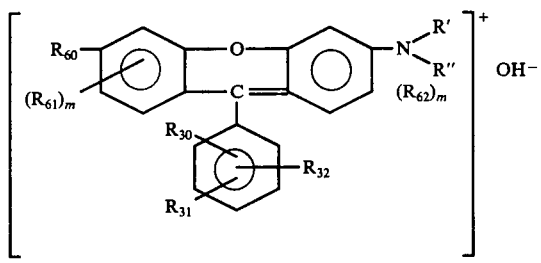

where $R_{60}$ is

m is one or two and
$R_{30}$, $R_{31}$ and $R_{32}$ each independently is hydrogen, sulfamyl, sodium sulfo, halo, carboxyl, carboloweralkoxy, or hydroxyl.

A particularly preferred subgroup of compounds have the formula

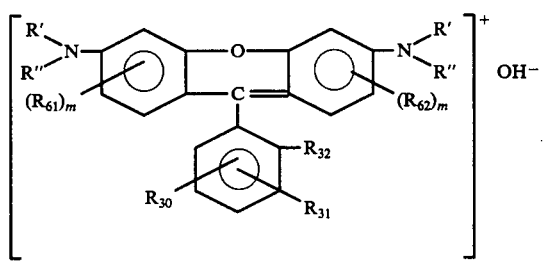

where R' and R" are hydrogen, lower alkyl, phenyl that is unsubstituted or substituted by lower alkyl or lower alkoxy
$R_{61}$ is lower alkyl
m is one
$R_{32}$ is carboxyl or carboloweralkoxy
$R_{30}$ and $R_{31}$ each independently is hydrogen, chloro, carboxyl or hydroxyl.

Amino derivatives of acridine dyestuffs whose free bases can successfully be employed herein have the general formula:

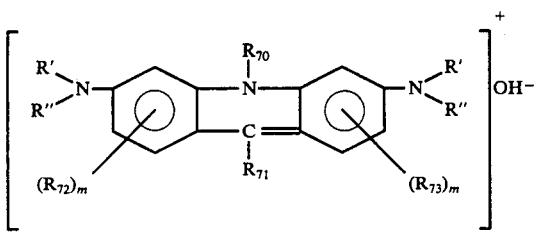

where $R_{70}$ is hydrogen or lower alkyl
$R_{71}$ is hydrogen, lower alkyl or phenyl that is unsubstituted or substituted by amino, carboxyl or di(loweralkyl)amino,
m is one, two or three
$R_{72}$ and $R_{73}$ each independently is hydrogen, lower alkyl or halogen
R' and R" are hydrogen or lower alkyl.

The methine and polymethine dyestuffs whose free bases can be used are those having Colour Index members C. I. 48010 through 48080.

It should be noted that the dyestuffs described hereinabove are independently known to the art, for example, the amino derivitives of triarylmethane dyestuffs that are useful are those having the indicated formula and having a Colour Index number between C. I. 42,000 and C. I. 44,520; useful amino derivitives of xanthene dyestuffs are those having the indicated formula and having a Colour Index number between C. I. 45,000 and C. I. 45,505; the acridine dyestuffs are those having a Colour Index number between C. I. 46,000 and C. I. 46,080.

Among the halogen containing compounds that release halide free radicals upon exposure to actinic radiation, there can be mentioned:
$CCl_4$
$CBr_4$
$CHI_3$
tris (2,3-dibromopropyl) phosphate
poly (dibromopropyl acrylate)
methyl methacrylate/dibromopropyl acrylate copolymer
Chlorowax 70 - a chlorinated paraffin sold by Diamond Alkali Co., Cleveland, Ohio
2.3 - dibromopropanol
trichloroacetamide
ethyl iodide
trichloroacetic acid
N-chlorosuccinimide
poly (vinyl chloride)
1,1,1- trichloro-2,2bis (parachlorophenyl) ethane
hexochloroethane
1,1,1 - trichloro - 2 methyl - 2 propanol
2,2,2-trichloroethanol
2,2,2 - trichloroethyl trichloroacetate
isooctyl trichloroacetate
isotridecyl trichloroacetate
2-methyl-2',4'-dichlorophenoxy ethanol
2,4,6-trichloroaniline While it is apparent that both aliphatic and aromatic halides can successfully be employed, it is preferred to use the aliphatic halides since the halogen atoms are less tightly bound to the aliphatic groups than they are to the aromatic groups. Of the aliphatic halides, it is generally preferred to use those halides having more than one halogen atom bound to the same carbon atom, and it is particularly preferred to use those halogenated aliphatic compounds where there are three halogen atoms bound to a single carbon atom. The halogen containing material can be present as single compound or as a mixture of halogen containing compounds.

A particularly preferred class of halogen containing materials comprises the normally solid amides of halogenated aliphatic carboxylic acids. Many of these compounds can be represented by the formula

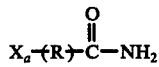

$$X_a{-}(R){-}\overset{O}{\underset{\|}{C}}{-}NH_2$$

where X is chloro, bromo or iodo
R is the residue of an aliphatic carboxylic acid and contains 1 to 6 carbon atoms and
a is an integer from 1 to 4.

In providing that $a$ is an integer from 1 to 4, it is noted that the obviously chemically impossible structures such as tetrachloroacetamide and $\beta,\beta,\beta$-trichlorobutyramide are excluded. Thus, the provision that $a$ is an integer from 1 to 4 is intended to be a shorthand way of indicating that $a$ is an integer from 1 to 3 when R has one carbon atom and that $a$ is an integer from 1 to 4 when R has 2 to 6 carbon atoms provided that no carbon atom bound to two other carbon atoms contains more than two halogen atoms and no carbon atom bound to one carbon atom contains more than 3 halogen atoms.

Of particular interest are those compounds where R is alkylene of 1 to 6 carbon atoms or alkenylene of 2 to 6 carbon atoms and particularly where R is methyl, ethyl, propyl, butyl, pentyl, hexyl, including isomers thereof, vinyl, allyl, isopropenyl, butenyl, isobutenyl, or pentenyl. These compounds preferably will melt in the range 90° to 150° C. Representative compounds include:

| Compound | Melting Point ° C |
| --- | --- |
| BrCH$_2$CONH$_2$ | 91° |
| ClCH$_2$CONH$_2$ | 121° |
| Cl$_2$CH CONH$_2$ | 99.4° |
| I CH$_2$CONH$_2$ | 95° |
| Br$_3$ C CONH$_2$ | 121.5° |
| Cl$_3$ C CONH$_2$ | 142° |
| Br CH$_2$CH$_2$CONH$_2$ | 111° |
| (CH$_3$)$_2$ C Br CONH$_2$ | 148° |
| CH$_3$CH$_2$CH Br CONH$_2$ | 112.5° |
| (CH$_3$)$_2$ CHCH Br CONH$_2$ | 133° |

In a preferred embodiment, the normally solid amide is acetamide, propionamide or butyramide that is substituted on a carbon atom by one to three of chlorine, bromine or iodine. Trichloroacetamide and tribromacetamide are particularly preferred, especially trichloroacetamide.

The amides described above are particularly preferred since their high melting points mean very little volatility; further, the amide functionality is believed to enhance the stability of the system.

The amount of halogen containing compound used should be sufficient to provide one halogen free radical per mole of dyestuff. It has been found that from 0.01 to 10 parts by weight of halogenated compound can be used per weight of dye base; amounts of about 0.1 to about 2 parts by weight of halogenated compound per part by weight of dye base are preferred and particularly preferred is from 0.5 to about 1.5 parts by weight of halogen containing compound per weight of dye base.

As indicated previously, the phototropic dye system described above can be formulated and incorporated in a dry film photoresist composition. Such compositions generally contain from about 10 to 70 parts by weight of one or more addition polymerizable ethylenically unsaturated compounds as defined, from 30 to 90 parts by weight of a preformed polymeric binding agent, from 0.001 to 10 parts by weight of a conventional free radical initiator and from 0.001 to 5 parts by weight of a conventional thermal addition polymerization inhibitor, and additionally, the compositions can contain such other additives as plasticizers, adhesion promoters and the like as may be necessary or desirable to enhance the physical and chemical properties of the photopolymerizable composition.

The addition polymerizable ethylenically unsaturated compound will generally have one to four or more terminal ethylenic groups, preferably two or more. Suitable compounds which can be used alone or in combination include the alkylene and polyalkylene glycol diacrylates prepared from alkylene glycols having two to fifteen carbon atoms or polyalkylene ether glycols of one to ten ether linkages.

Because of their generally more rapid rate of insolubilization on exposure to free radicals, presumably due to a relatively rapid establishment of a network polymer structure, an outstanding class of addition polymerizable ethylenically unsaturated compounds are those having a plurality of addition polymerizable ethylenic linkages, particularly when present as terminal linkages, and especially those wherein at least one and preferably most of such linkages are conjugated with a doubly bonded carbon, including carbon doubly bonded to carbon and to such heteroatoms as nitrogen, oxygen, and sulfur. Outstanding are such materials wherein the ethylenically unsaturated groups, especially the vinylidene groups, are conjugated with ester or amide structures. The following specific compounds are further illustrative of this class: unsaturated esters of polyols, particularly such esters of the alpha-methylene carboxylic acids, e.g., ethylene diacrylate; diethylene glycol diacrylate; glycerol diacrylate; glycerol triacrylate; ethylene dimethacrylate; 1,3 - propanediol dimethacrylate; 1,2,4-butanetriol trimethacrylate; 1,4-benzene-diol dimethacrylate; 1,4-cyclohexanediol diacrylate; pentaerythritol tri- and tetramethacrylate; pentaerythrital tetraacrylate; 1,3-propanediol diacrylate; 1,5-pentanediol dimethacrylate; the bis-asrylates and methacrylates of polyethylene glycols of molecular weight 200-1500 and the like; unsaturated amides, particularly those of the alpha-methylene carboxylic acids, and especially those of alpha, omega-diamines and oxygen-interrupted omega-diamines, such as methylene bisacrylamide; methylene bis-methacrylamide; 1,6-hexamethylene bisacrylamide; diethylene triamine tris-methacrylamide; bis (methacrylamidopropoxy) ethane; beta-methacrylamidoethyl methacrylate; N-[(beta-hydroxyethyloxy)ethyl] acrylamide; vinyl esters such as divinyl succinate, divinyl adipate, divinyl phthalate, divinyl terephthalate, divinyl benzene - 1,3-disulfonate, and divinyl butane - 1,4-disulfonate; and unsaturated aldehydes, such as sorbaldehyde (hexadienal).

In a preferred embodiment the ethylenically unsaturated addition polymerizable compound is an acrylyl or methacrylyl compound or derivative thereof, including low molecular weight polymerizates, i.e., oligomers. Particularly useful results are obtained when the dry film photoresist composition contains a preferred curable or crosslinkable polymer or oligomer and an acrylyl ester as the ethylenically unsaturated addition polymerizable compound. The acrylyl esters that are particularly useful are the mono- and polyacrylyl compounds of general formula

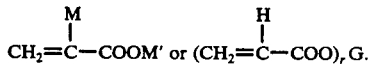

Where the acrylyl compound has the formula

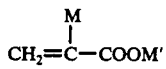

M is H or Cl

M' is cycloalkyl of 5 to 12 carbon atoms (such as cyclopentyl, dicyclopentyl, methylclyclopentyl, dimethylcyclopentyl, etc.)

cycloalkenyl of 5 to 12 carbon atoms (such as cyclopentenyl, methylcyclopentenyl, dicyclopentenyl, bicyclo [2.2.1] hept-2-en-yl, etc.)

—$C_pH_{2p}M''$ or $(C_qH_{2q}O)_sC_qH_{2q+1}$ ;

where
  $p$ is an integer from 1 to 10
  $q$ is an integer from 2 to 4
  $s$ is an integer from 0 to 4
  M'' is hydrogen, hydroxyl, phenoxy, alkoxy of 1 to 8 carbon atoms;

and where the acrylyl compound has the formula

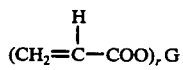

G is a polyvalent alkylene group of formula

- $C_xH_{2x-y}$ - in which
  $x$ is an integer from 2 to 8
  $y$ is an integer from 0 to 2
(for example, divalent alkylene when $y = O$ such as —$C_2H_4$—, $C_3H_6$—iso—$C_3H_6$—, —$C_5H_{10}$—, neo—$C_6H_{12}$etc; trivalent alkylene when $y = 1$ such as

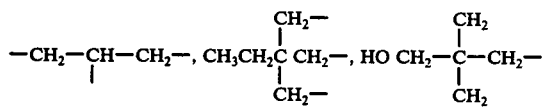

or tetravalent alkylene when y is 2, such as

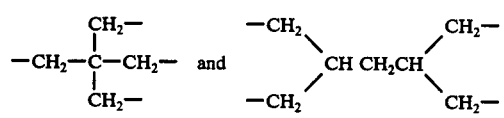

etc.)
or G is a divalent ether or ester group of formula

—$(C_qH_{2q}O)_tC_qH_{2q}$— or

—$(C_qH_{2q}COO)_tC_qH_{2q}$— where $t$ is an integer from 1 to 5 and $q$ is an integer from 2 to 4 (such as oxyethylene, oxypropylene, oxybutylene, polyoxyethylene, polyoxypropylene, polyoxybutylene, etc.)

and $r$ is the valence of G and can be 2 to 4.

Especially preferred acrylyl compounds are triethylene glycol diacrylate, tetraethylene glycol diacrylate, pentaerythritol triacrylate, trimethylol propane triacrylate and pentaerythritol tetraacrylate.

As preformed polymeric binding agent there can be employed polystyrene, polycarbonate, polyurethane, polyformaldehyde, polyvinyl acetal (including polyvinyl butyral), polyvinyl chloride and copolymers, polyethers (including polyethylene oxide, polypropylene oxide, polytetrahydrofuran), polyacrylates (including polymethyl methacrylate, polyethyl methacrylate, polymethyl/acrylate and polyethyl acrylate), polyvinyl esters (including polyvinyl acetate and polyvinyl acetate/acrylate), cellulose esters (including cellulose acetate and cellulose acetate butyrate), cellulose ethers (including methyl cellulose and ethyl cellusose), modified polyolefins (including ethylene/vinyl acetate copolymers) polyvinylidene chloride (including copolymers of vinylidine chloride with acrylonitrile, methyl methacrylate and vinyl acetate), polyamide (including polycaprolactone, polycaprolactam, and polyhexamethylene adipamide) and polyester (including polyethylene glycol terephthalate, and polyhexamethylene succinate).

Photoinitiators used in the compositions are preferably those that are activated by actinic light and thermally inactive at 185° C. or below. These include the substituted or unsubstituted polynuclear quinones, such as, 9,10-anthraquinone; 1-chloranthraquinone, 2-chloroanthraquinone, 2-methylanthraquinone; 2-ethylanthraquinone; 2-tert-butylanthraquinone; octamethylanthraquinone; 1,4-napththaquinone; 9, 10-phenanthraquinone; 1,2-benzathraquinone; 2,3-benzanthraquinone; 2-methyl-1, 4-napthoquinone; 2,3-dichloronapthoquinone; 1,4-dimethylanthraquinone; 2,3-dimethylanthraquinone; 2-phenylanthraquinone; 2,3-diphenylanthraquinone; sodium salt of anthraquinone alpha-sulfonic acid; 3-chloro-2-methylanthraquinone; retenequinone; 7,8,9,10-tetrahydronaphthacenequinone; 1,2,3,4-tetrahydrobenz(a) anthracene-7,12-dione.

The following photoinitiators, described in U.S. Pat. No. 2,760,863, some of which may be thermally active at temperatures as low as 85° C. are also useful: vicinal ketaldonyl compounds, such as, diacetyl and benzil; alpha-ketaldonyl alcohols, such as, benzoin and pivaloin; acyloin ethers, e.g., benzoin methyl and ethyl ethers; alpha-hydrocarbon substituted aromatic acyloins; alphamethylbenzoin; alpha-allylbenzoin; and alpha-phenylbenzoin.

Specific benzoin ethers include benzoin methyl ether, benzoin ethyl ether, benzoin phenyl ether, methylbenzoin, and ethylbenzoin.

Silver persulfate is also useful as a free-radical generating initiators activatable by actinic radiation. Certain aromatic ketones, e.g., benzophenone and 4,4'-bisdialkylamino-benzophenones, are also useful. Specific compounds include benzophenone, 4,4'-bis(dimethylamino)-benzophenone, 4,4'bis(diethylamino) benzophenone, 4-hydroxy-4'-diethylaminobenzophenone, 4-hydroxy-4'-dimethylaminobenzophenone, 4-acryloxy-4'-dimethylaminobenzophenone, and 4-methoxy-4' dimethylaminobenzophenone.

The initiator preferably contains at least one of an acyloin ether, an alkyl-substituted anthraquinone where said alkyl group contains one to four carbon atoms, benzophenone or an alkylaminobenzophenone.

Thermal polymerization inhibitors are also present in the preferred compositions. These include p-methoxyphenol, hydroquinone, and alkyl and aryl-substituted hydroquinones and quinones, tert-butyl catechol, pyrogallol, copper resinate, naphthylamines, betanaphthol, cuprous chloride, 2,6-di-tert-butyl p-cresol, 2,2'-methylenebis-(4-ethyl-6-t-butylphenol), phenothiazine, pyridine, nitrobenzene, dinitrobenzene, p-toluquinone, chloranil, aryl phosphites, and aryl alkyl phosphites.

A typical useful dry film resist will contain from about 40 to 70% by weight of polymeric binder, from 30 to 50% by weight of one or more monomers, from 1 to 10% by weight of sensitizer, from 0.01 to 2% by weight of dye base as described herein and from 0.1 to 4% by weight of halogen containing compound. Preferred ranges are from 50 to 70% by weight of binder, from 30 to 40% by weight of monomers; from 2 to 5% by weight of sensitizer and from 0.5 to 1.5% by weight of free base of dyestuff and from 0.8 to 2% by weight of halogen containing compound.

The photoresist compositions can additionally contain other components such as antioxidants and adhesion promotors.

In use, the photopolymerizable dry film is exposed to a source of actinic radiation which may be through a half-tone image or a process transparency; e.g., a process negative or positive, stencil or a mask. Exposure may also be through a continuous tone, negative or positive image. The exposure can be by the contact or projection method, with or without a cover sheet over the photopolymerizable layer or by projection using a cover sheet. These procedures are well known to those skilled in the art. The photoresist compositions are generally used in conjunction with ultraviolet light and the radiation source should furnish an effective amount of this radiation; point or broad radiation sources are effective. Such sources include carbon arcs, mercury-vapor arcs, fluorescent lamps with ultraviolet radiation emitting phosphors, argon glow lamps, electronic flash units and photographic flood lamps. Of these, the mercury vapor arcs, particularly the sun lamps, are most suitable.

The dry film photoresist compositions after exposure can be developed in known manner, for example by impingement of spray jets, with agitated immersion brushing or scrubbing to desirable images with an organic solvent or mixture thereof capable of washing away the unexposed portions of the resist film. Useful solvents include cellosolve acetate, ethyl acetate, methyl ethyl ketone, acetone, trichloroethylene, carbon tetrachloride, tetrachloroethylene, the alkanols of one to four carbon atoms, butyl cellosolve, chlorobenzene and dimethylformamide.

The phototropic dye systems described above are also useful in ultraviolet-curable coating and printing compositions. As indicated previously, one advantage that attends such compositions formulated with the phototropic dye systems is that thicker coatings can be employed than was previously the case since actinic light can penetrate through to the bottom of the coating before the color of the composition has intensified. Since color can now be obtained without pigments and the like which interfere with the penetration of actinic light, thicker, more resistant coatings are obtainable.

In general, the coating and printing compositions will contain:

a. an addition polymerizable ethylenically unsaturated compound capable of forming a high polymer by free-radical initiated addition polymerization, b. a free-radical generating addition polymerization initiator activatable by actinic radiation, c. the free base of a dyestuff whose halide salt is more intensely colored than the free base, d. a halogen containing compound that releases halide free radicals upon exposure to actinic light.

As a general proposition, these coating and printing compositions will contain from 0.1 to about 3% by weight of dye base as previously defined, and from about 0.1 to about 4% by weight of halogen containing compound, also as previously described. The composition will contain from about 1 to about 10% by weight of photoinitiator, the balance being ethylenically unsaturated compounds and other additives, such as, antioxidants, fillers, thixotropic and leveling agents, adhesion promotors and plasticizers. Pigments and the like can be added if desired.

While the ethylenically unsaturated compounds previously described are useful, the acrylyl compounds are particularly useful, especially in the form of acrylyl oligomers and esters, as described above.

One useful class of oligomers is obtained by reacting an organic polyether or polyester polyol with a diisocyanate to provide an isocyanate-terminated prepolymer. This product can be reacted with an unsaturated alcohol, such as a hydroxy alkyl acrylate to provide, either alone or in combination with other unsaturated monomers, a material that will polymerize under the influence of free radicals to form a hard, tough, adherent film.

In a variation of the forgoing, a polymercaptoester such as trimethylolpropane tris (thioglycolate); trimethylolpropane tris(mercaptopropionate); pentaerythritol tetrakis (thioglycolate);pentaerythritol tetrakis (mercaptopropionate); and the like are reacted with a diisocyanate to provide a polythiourethane intermediate which can be reacted with an unsaturated alcohol, such as a hydroxy acrylate to provide, either alone or in combination with other unsaturated monomers, a free radical polymerizable material having excellent film properties after crosslinking.

Another illustration of a useful oligomer is an acrylate-capped polycaprolactone polyurethane, obtained by reacting a hydroxy terminated polycaprolactone with a diisocyanate and thereafter reacting the isocyanate terminated intermediate with an unsaturated alcohol such as a hydroxy alkyl acrylate.

Still another useful class of oligomers is obtained by reacting an epoxy resin with acrylic acid to obtain an epoxy diacrylate. For example, an epichlorohydrin/bisphenol A-type epoxy resin can be reacted with a stoichiometric amount of acrylic acid. Such products are availale commercially as under the trademark "Epocryl" from Shell Chemical Company. Such materials can be combined with a variety of acrylic esters including neopentyl glycol diacrylate, hydroxy ethyl acrylate and dicyclopentenyl acrylate and other unsaturated esters of polyols including such esters of methylene carboxylic acid such as, ethylene diacrylate; diethylene glycol diacrylate; glycerol diacrylate; glycerol triacrylate; ethylene dimethacrylate; 1,3-propylene dimethacrylate;

1,2,4-butanetriol trimethacrylate; 1,4-benzenediol dimethacrylate; pentaerythritol tetramethacrylate; 1,3-propanediol diacrylate; 1,6-hexanediol diacrylate; the bis-acrylates and methacrylates of polyethylene glycols of molecular weight 200–500; trimethylolpropane triacrylate; pentaerythritol triacrylate; and other ethylenically unsaturated compounds, to polymerize under the influence of free radicals to form films of excellent adhesion and toughness.

Another composition comprises a combination of a terminally unsaturated urethane composition (polyene) and a polythiol which are polymerizable under the influence of free radicals generated by the action of actinic light on a photoinitiator.

The coating and printing ink compositions will contain a predominant amount of film forming materials and photosensitizer and a relatively minor amount of dye base and halogen compound. For example, a typical composition will contain from 15 to 70% by weight of an ethylenically unsaturated compound as described above, 10–50% of one or more unsaturated monomers or of a preformed polymeric binder, 0.1 to 10% by weight of a photoinitiator; 0.01 to 3% by weight of dye base as described above and 0.1 to about 5% of halogen containing compound. A more narrow range is from about 40 to about 55% by weight of ethylenically unsaturated compound, from 30–45% of monomer or of polymeric binder from 0.5 to 7% of initiator, from 0.5 to 2% of dye base and from 0.8 to 4% of halogen compound.

The invention is illustrated by the following examples:

EXAMPLE 1

Dye-halogen combinations are evaluated with respect to image and stability in the following composition:

|  | Parts by wt. |
|---|---|
| Acryloid A-101[a] (solids basis) | 40.0 |
| trimethylolpropane triacrylate | 13.0 |
| tetraethylene glycol diacrylate | 6.5 |
| benzophenone | 2.25 |
| 4,4'-bis(dimethylamino) benzophenone | 0.3 |
| 2,2'-methylenebis(4-ethyl-6-t-butylphenol) | 0.12 |
| 2-mercaptobenzoxozole | 0.33 |
| Modaflow | 0.10 |
| Tricresyl Phosphate | 2.88 |
| Methyl Ethyl Ketone | 130 |

[a] An acrylic ester polymer in organic solvent from Rohm & Haas Company

After the dye and halogen containing compound are incorporated, the solution is coated onto a 1 mil thick polyester film and dried in air. The dry thickness of the sensitized layer is 1 – 2 mils. The dried layer is covered with a 1 mil thick polyethylene film.

The phototropic capacity is determined visually by removing the polyethylene film, laminating the photopolymerizable composition to a copper-clad panel, placing a light mask over the assembly and exposing this combination to a mercury vapor lamp for 30 seconds. Image is read immediately, using a scale of −10 to 10. Zero means no image, a negative rating indicates the dye system is photofugitive (i.e., fades) while a positive rating indicates the system is phototropic.

Stability measures the ability of a liquid composition to provide a phototropic image-forming film after being stored for 2 weeks at 46° C.

| Dye | Amount | Halide | Amount | Image | Stability |
|---|---|---|---|---|---|
| 1 + 2 | 0.3 + 0.1 | A | 1.8 gms | 6–7 | nil |
| " | " | B | " | 7 | nil |
| " | " | C | " | 5–6 | nil |
| " | " | D | " | 5–6 | nil |
| " | " | E | " | 5 | nil |
| " | " | F | " | 5 | nil |
| " | " | G | " | 5 | nil |
| " | " | H | " | 2 | nil |
| " | " | I | " | 2 | nil |
| " | " | J | " | 3 | nil |
| 3 | 0.4 | A | 1.8 gms | 3–4 | nil |
| " | " | B | " | 3–4 | nil |
| " | " | F | " | 3–4 | nil |
| " | " | E | " | 3–4 | nil |
| " | " | K | " | 2 | nil |
| " | " | G | " | 4 | nil |
| 4 | 0.4 | A | 1.8 | nil | — |
| " | " | C | " | nil | — |
| " | " | D | " | nil | — |
| 5 | " | A | " | nil | — |
| 6 | " | A | " | nil | — |
| 6 | " | C | " | nil | — |
| 6 | " | D | " | nil | — |
| 7 + 2 | 0.3 + 0.1 | B | " | 2 | — |
| 8 | 0.4 | B | " | 1 | — |
| 9 + 3 | 0.1 + 0.3 | B | " | 3–4 | — |
| 9 + 10 | 0.1 + 0.3 | B | " | 6 | — |
| 9 + 11 | 0.1 + 0.3 | B | " | 6 | — |
| 9 | 0.4 | B | " | −2 | — |
| 12 | 0.03 | B | " | 3 | nil |
| 10 | 0.4 | B | 1.8 | nil | — |
| 13 | 0.4 | B | " | 2–3 | — |
| 13 | 0.4 | none | " | −1 | — |
| 13 | 0.4 | B* | " | 5–6 | stable |
| 13 + 11 | 0.1 + 0.3 | B* | " | 7–8 | stable |
| 11 | 0.6 | B | " | 5–6 | stable |
| 11 + 13 + 14 | .06 + .4 + .1 | B | " | 5–7 | stable |

*Mercaptobenzoxazole replaced by benzotriazole

Dye
1. Leuco Blue
2. Rhodamine F3B
3. Leuco Green
4. N,N-dimethyl-p-phenylene diamine
5. 1-naphthylamine
6. 4,4'-methylenebis-(N,N-dimethylaniline)
7. Brilliant Basic Leuco Blue 8. Basic Leuco Blue
9. Hecto Blue
10. Malachite Green
11. Rhodamine B Base
12. Crystal Violet
13. Malachite Green Base
14. Oil Soluble Blue II
15. Methyl Violet Halide
A  2,3-dibromopropanol
B  Trichloroacetamide
C  Hexachlorobenzene
D  1,1,1-trichloro-2,2-bis(p-chlorophenyl)ethane
E  1,1,1-trichloro-2-methyl-2-propanol
F  2,2,2-trichloroethanol
G  Trigonal P-1
H  Trichloroethyl trichloroacetate
I  Isooctyl trichloroacetate
J  Isotridecyl trichloroacetate
K  Trichloroethyl trichloroacetamide From the foregoing it is seen that, while a variety of dye-halide combinations are effective to provide a positive image, it is only the free bases of the dyestuffs that provide a stable system. This capacity to be resistant to elevated temperatures has important practical considerations. The liquid photopolymerizable composition is exposed to temperatures on the order of 200° F. during the coating operation while the dry film is exposed to temperatures on the order of 250° F. and above during the lamination step. A useful phototropic composition must not be affected by these temperatures. Further, the liquid compositions are typically mixed and stored in drums for periods ranging from a few days to several weeks prior to being coated on a support and formed into an assembly comprising a support, photopolymerizable composition adhered to the support and transparent sheet adhered to the top of the photopolymerizable composition.

The best results in terms of image and stability are obtained with the normally solid amides of halogenated aliphatic carboxylic acids, as previously described.

EXAMPLE 2

The following composition is used to evaluate image and speed of various dye-halide combinations, using the technique of Example 1 to form the dry film.

Speed is determined by measuring the size of a line obtained in a 30 second exposure. The negative size is 9.88 mm; a larger size line in 30 seconds indicates a faster system while a smaller size line in 30 seconds indicates a slower system.

Dye numbers and halide letters refer to Example 1.

Here again, it is seen that the phototropic systems described above have good imaging characteristics and good speed.

| | |
|---|---|
| Poly(methyl methacrylate) | 57.42 |
| trimethylolpropane triacrylate | 23.93 |
| tetraethylene glycol diacrylate | 11.96 |
| Benzophenone | 3.23 |
| 4,4'-bis(dimethylamino)benzophenone | 0.43 |
| 2,2'-methylenebis(4-ethyl-6-t-butyphenal) | 0.17 |
| Benzotriazole | 0.17 |
| Tolyltriazole | 0.06 |
| Trichloroacetamide | 1.44 |
| Modaflow | 0.22 |
| Methyl Ethyl Ketone | 150 |

| Dye | Amount | Halide | Amount | Image | Speed |
|---|---|---|---|---|---|
| 13 | 0.08 | none | — | −3 | 9.92 |
| 11 | 0.6 | none | — | 1 | 9.79 |
| 11 + 13 | 0.6 (0.08) | none | — | −1 | 9.88 |
| 14 | 0.1 | none | — | −2 | 9.83 |
| 14 + 13 + 11 | 0.1 + 0.4 + 0.06 | none | — | −2 | 9.83 |
| 13 | 0.4 | none | — | −3 | 9.88 |
| 2 | 0.09 | none | — | 0 | 9.88 |
| 12 + 9 | .03 + .03 | none | — | −3 | 9.88 |
| 15 | .05 | none | — | −3 | 9.92 |
| 13 | .08 | B | 1 gm | 4 | 9.92 |
| 11 | 0.6 | B | 1 gm | 5 | 9.79 |
| 11 + 13 | 0.6 + 0.08 | B | 1 gm | 6 | 9.92 |
| 14 | 0.1 | B | 1 gm | −1 | 9.79 |
| 14 + 13 + 11 | 0.1 + 0.4 + 0.06 | B | 1 gm | 7 | 9.71 |
| 13 | 0.4 | B | 1 gm | 7 | 9.83 |
| 2 | 0.09 | B | 1 gm | 0 | 9.88 |
| 12 + 9 | .03 + .03 | B | 1 gm | −1 | 9.83 |
| 15 | 0.05 | B | 1 gm | 1 | 9.83 |
| 11 + 13 + 14 | 0.06 + 0.4 + 0.1 | B | 1 gm | 8 | 9.83 |

EXAMPLE 3

A photoresist composition useful to evaluate various combinations of dye bases and halogenated compounds is prepared from the following ingredients:

| | Parts by Weight |
|---|---|
| poly (methyl methacrylate)[1] | 61.12 |
| pentaerythritol triacrylate | 32.09 |
| Benzophenone | 3.06 |
| 4,4'- bis-(dimethylamino) benzophenone | 0.15 |
| 2,2'- methylene-bis-(4-ethyl-6-t-butylphenol) | 0.92 |
| Benzotriazole | 0.23 |
| Methyl ethyl ketone | 150.00 |
| Dye Base | 0.92 |
| Halogen-containing compound | 1.53 |

[1]A medium molecular weight material available from E. I. DuPont de Nemours & Co., Inc., Wilmington, Delaware under the trademark Elvacite 2010.

The composition is made by dissolving the methyl methacrylate polymer in the MEK, using conventional equipment at low to medium speeds, then adding the monomer and then adding the sensitizers and other ingredients.

The solution is coated onto a 1 mil thick polyester film and dried in air. The dry thickness of the sensitized layer is 1–2 mils. The dried layer is covered with a 1 mil thick polyethylene film.

The following tabulation relates dye, halogen-containing compound, developed color and stability at 46° C.

| Dye | Halogenated Compound | Stability | Color |
|---|---|---|---|
| C.I. Solvent Green 1 (Malachite Green Base) | CCl₄ | unstable | blue-green |
| " | *CBr₄ | unstable | dark green-blue |
| " | *CHI₃ | unstable | dark green-blue |
| " | ᵒtris(2,3-dibromopropyl)phosphate | stable | green-blue |
| " | poly(dibromopropyl acrylate) | stable | blue-green |
| " | ᵒtetrabromobisphenol | stable | green-blue |
| " | methyl methacrylate/dibromopropyl acrylate copolymer | stable | blue-green |
| " | Chlorowax 70 | stable | blue-green |
| " | ᵒ2,5-dichloro-p-xylene | stable | green-blue |
| " | 2,3-dibromopropanol | stable | blue-green |
| " | *trichlorocetamide | stable | blue-green |
| " | 4-chlorobenzophenone | stable | green-blue |
| " | ethyl iodide | unstable | dark green-blue |
| " | ᵒtrichloroethyl phosphate | stable | green-blue |
| " | trichloroacetic acid | stable | green-blue |
| " | N-chlorosuccinimide | stable | green-blue |
| " | poly(vinyl chloride) | stable | green-blue |
| " | ᵒ1,1,1-trichloro-2,2-bis-(p-chlorophenyl)ethane | stable | green-blue |
| " | ᵒhexabromobenzene | stable | green-blue |
| " | ᵒhexachloroethane | stable | green-blue |
| " | ᵒhexabromobiphenyl | stable | green-blue |
| " | ᵒ1,1,1-trichloro-2-methyl 2-propanol | stable | green-blue |
| " | *2,2,2-trichloroethanol | unstable | green-blue |
| " | ᵒ1,1-diethyl-2,2'-dicarbox iodide | stable | green-blue |
| " | 2,2,2-trichloroethyl trichloroacetate | stable | green-blue |
| " | *2,4,6-trichloroaniline | unstable | blue-green |
| " | isooctyl trichloroacetate | stable | green-blue |
| " | *isotridecyl trichloroacetate | stable | blue-green |
| " | *2-methyl-2',4'-dichlorophenoxy ethanol | unstable | blue-green |

ᵒ = light initial color
* = dark initial color

It is noted that the organic iodides and bromides tend to produce a stronger coloration in the developed dye, while the organic chlorides tend to result in a more stable system. Trichloroacetamide gives best results.

When the free base of Fuchsine, C. I. Solvent Red 41 is used, the results are comparable, the free base providing a stable system that intensifies in color to a reddish violet upon exposure to light.

The free base of Crystal Violet, C. I. Solvent Violet 9 similarly forms a stable system that intensifies in color on exposure to light.

The following dye bases yield stable systems with all of the halogen containing compounds described above.

| Dye | Developed Color |
|---|---|
| C. I. Solvent Blue 2 | red-blue |
| C. I. Solvent Blue 5 | red-blue |
| C. I. Solvent Red 49 | red-violet |
| C. I. Solvent Violet 10 | red-violet |
| C. I. 42510B | red-violet |
| C. I. 42535B | blue-violet |
| C. I. 42600 | blue-violet |
| C. I. 44520 | violet |
| C. I. 45006 | red |
| C. I. 45015 | red |
| C. I. 45310 | red |
| C. I. 46025 | yellow |
| C. I. 46055 | orange |
| C. I. 48013 | red-violet |

The following two compounds, when screened in the above formulation, are found to be unstable in that the liquid formulation gradually darkens on standing:
 leuco Crystal Violet
 leuco Malachite Green The following compounds, when screened in the formulation of Example 1 were not phototropic - i.e., image was zero.
 N,N-dimethyl-p-phenylene diamine
 N-methyl-diphenylamine
 1-naphthylamine
 4,4'-methylenebis(N,N-dimethylaniline)
 Malachite Green powder, dry

EXAMPLE 4

The following solution is coated onto a 1 mil thick polyester film to provide a dry thickness of about 0.001 inch, and dried in air. The dried film is covered with a 1 mil thick polyethylene film.

| Ingredients | Parts by Weight |
|---|---|
| copolymer of 75% styrene and 25% methacrylic acid; viscosity of a 40% solution in MEK is 10,360 cps | 56.93 |
| trimethylolpropane triacrylate | 24.64 |
| tetraethylene glycol diacrylate | 12.32 |
| benzophenone | 3.97 |
| 4,4'-bis-(dimethylamino)-benzophenone | 0.53 |
| C.I. Solvent Red 49 (C.I. 45170B) | 0.8 |
| trichloroacetamide | 1.5 |
| benzotriazole | 0.37 |
| methyl ethyl ketone | 160 |

A piece of copper clad, epoxy-fiberglass board is cleaned by scouring with an abrasive cleaner, swabbing and thoroughly rinsing in water. It is given a 20 second dip in dilute hydrochloric acid solution (2 volumes water plus 1 volume concentrated hydrochloric acid), a second rinse with water and then dried with air jets.

The polyethylene cover film is removed from a section of the sandwiched photoresist dry film described above. The bared resist coating with its polyester support is laminated to the clean copper with the surface of the photoresist in contact with the copper surface. The lamination is carried out with the aid of rubber covered rollers operating at 250° with a pressure of 3 pounds per lineal inch at the nip at a rate of 2 feet per minute. The resulting sensitized copper clad board protected as it is by the polyester film can be held for later use if desired. Exposure to light is had through a high contrast transparency image in which the conducting pattern appears as transparent areas on an opaque background. Exposure is carried out by placing the sensitized copper clad board (with polyester film still intact) and the transparency into a photographic printing frame. Exposure is maintained for a period of 90 seconds to a 400 watt, 50 ampere vapor lamp at a distance of 12 inches. It is seen that the areas of the resist that have been exposed to light have darkened in color considerably, to a dark red which contrasts substantially with the unexposed portions of the resist. The polyethylene terephthalate support film is peeled off and the exposed resist layer developed by agitating the board in a tray containing 2% trisodium phosphate in water for 2 minutes followed by a water rinse. The resulting board contained a deeply colored resist pattern of the clear areas of the exposing transparency, then rinsed and dried. The resist is removed from the remaining copper by dipping for 2 minutes in a 3% solution of sodium hydroxide in water at 70° C. The result is a high quality printed circuit board.

In an alternative embodiment, the surface of the exposed copper obtained after developing is further cleaned by dipping the board into a 20% ammonium persulfate bath for 30 seconds, washing copiously with water, dipping for 30 seconds in a 20% solution of hydrochloric acid in water, rinsing with water, then drying the board with jets of air. This cleaned board is then plated for 45 minutes at 30 amperes per square foot in a copper pyrophosphate plating bath at 55° C.

EXAMPLE 5

A copper clad piece of epoxy-fiberglass board is cleaned as described in Example 4, above. The cleaned, dried board was sensitized by flowing the following solution over the surface of the board:

|  | Parts by Weight |
|---|---|
| Copolymer of 37% styrene and 63% monobutyl maleate, average mol. wt. 20,000, viscosity of 10% aqueous solution of ammonium salt = 150 cps. | 59.75 |
| Pentaerythritol tetraacrylate | 34.35 |
| Benzophenone | 2.24 |
| 4,4'-bis-(dimethylamino)-benzophenone | 0.3 |
| Benzotriazole | 0.22 |
| 2,2'-methylene-bis-(4-ethyl-6-tert-butylphenol) | 0.9 |
| C. I. Solvent Red 49 (C. I. 45170B) | 0.8 |
| Trichloroacetamide | 1.44 |
| Methyl Ethyl Ketone | 150 |

The excess solution is drained off the board at room temperature for 2 minutes. The coating is further dried by heating in a forced air oven at 60° C. for 5 minutes.

After cooling, the coated board is exposed as described in Example 4 above, and it is seen that where the board is exposed to light, a dark red color that dramatically contrasts with the unexposed portions is visible. The resist is developed by agitating the board in a solution of 2% trisodium phosphate in water for one minute, followed by a water rinse. The board is etched in ferric chloride as described in Example 4, and after etching, the exposed resist is stripped from the protected copper by immersing the board in a 3% solution of sodium hydroxide in water at 50° C. for 2 minutes. The result is a high quality printed circuit board.

EXAMPLE 6

Coating compositions are prepared from the following amounts of components:

| Components | Composition, Parts by Weight | | | | |
|---|---|---|---|---|---|
|  | I | II | III | IV | V |
| PCP[a] | 36.2 | — | — | — | — |
| EPOA[b] | 4.8 | 4.5 | — | — | — |
| E.D.[c] | 16.2 | 57.0 | 54.5 | 59.5 | 47.6 |
| NPGDA[d] | 14.2 | 18.1 | 17.3 | 19.0 | 19.0 |
| HEA[e] | 14.2 | 9.0 | 8.7 | 9.5 | 9.5 |
| DCPA[f] | 9.6 | 6.9 | 15.2 | 7.2 | 19.0 |
| Sensitizer[g] | 4.8 | 4.5 | 4.3 | 4.8 | 4.9 |
| Dye Base[h] | 0.9 | 0.9 | 0.9 | 0.9[j] | 0.9[k] |
| Trichloroacetamide | 1.5 | 1.5 | 1.5 | 1.5 | 1.5 |

[a] 80% solution of Union Carbide PCP-0300 polycaprolactone/toluene diisocyanate oligomer in 20% hydroxyethyl acrylate
[b] polyacrylate of epoxidized soya bean oil available from Union Carbide
[c] Epon Diacrylate
[d] neopentyl glycol diacrylate
[e] hydroxyethyl acrylate
[f] dicyclopentenyl acrylate
[g] 4.5 parts benzophenone/0.5 parts Michlers Ketone
[h] Rhodamine B Base
[j] Malachite Green Base (C. I. 42000B)
[k] C. I. Solvent Blue 4 (C. I. 44045B)

The compositions are prepared by adding the Epon Diacrylate polymer to the monomers and mixing in conventional equipment at low to medium speeds until dissolved. The photosensitizer is added and the other ingredients are incorporated.

The coatings are applied to a cellulosic substrate (hardboard) by direct roller coating. The wet coated substrate is then exposed to UV radiation by being placed on a chain link conveyor and passed under a 200 watt/lineal inch Hanovia quartz ultraviolet lamp at a distance of about two inches at a speed of approximately 12 feet per minute.

Tough, resistant, deeply colored coatings are obtained.

EXAMPLE 7

An ink composition is prepared as follows by mixing together the following components in conventional manner.

| Epoxy Acrylate | 59.69 |
|---|---|
| Utraflex Microcrystalline Wax | 3.35 |
| Pentaerythritol Tetraacrylate | 29.57 |
| Benzophenone | 4.47 |
| Michler's Ketone | .50 |
| Rhodamine B Base | 1.0 |
| Trichloroacetamide | 1.50 |

When this ink is slik screened onto a paper substrate and exposed to light using a 200 watt/linear inch medium pressure mercury vapor lamp at a distance of 4 inches for about 5 seconds, there is obtained a dry, tack-free red-printed substrate having good glass and adhesion.

When the Rhodamine B base is replaced by the dye bases described in Example 3, there is obtained an ink that cures to a dry, tack-free, deeply colored product.

EXAMPLE 8

A U.V. curable urethane composition is prepared by heating 104.4 grams (0.6 moles) of tolylene diisocyanate to 70° C. and, while maintaining this temperature adding dropwise over 2 hours a homogeneous solution, also heated to 70° C., consisting of 26.8 grams of trimethylolpropane, 79.0 grams of methyl methacrylate and 0.02 grams p-benzoquinone. At the end of the reaction period, the product is maintained at 70° C. for an additional 6 hours. There is, thereafter, added dropwise 57.2 grams of 2-hydroxyethyl methacrylate over a period of one-half hour, after which the reaction is continued for an additional 10 hours, followed by the addition of 43 grams methyl methacrylate, to obtain a methyl methacrylate solution of a light yellow, transparent photopolymerizable prepolymer containing approximately 1.8% by weight of isocyanate groups.

3.1 grams of benzoine methyl ether are added to the prepolymer solution and the composition is mixed to prepare a homogeneous composition.

To 97.5 grams of the photopolymerizable composition prepared above is added 1.5 grams of trichloroacedimide and 1 gram of Rhodamine B Base. The composition is mixed until a homogeneous period. The photopolymerizable composition is applied to a wooden test piece, having a smooth surface, at the rate of 100 grams per square meter and the coated surface is covered with a 30 mm. thick untreated polyethylene film exercising care to insure that no air bubbles are entrained. This is then exposed to actinic rays with a 2-KW high pressure mercury-vapor lamp for 30 seconds at a radiation distance of 30C. When the polyethylene film is stripped, it is seen that a smooth cured coating is obtained having good hardness, good adhesion to the wood and that is a deep red in color.

What we claim is:

1. A stable photopolymerizable composition comprising:
    a. an acrylyl or methacrylyl compound thereof capable of forming a high polymer by free radical initiated polymerization;
    b. a free-radical generating addition polymerization initiator activatable by actinic radiation;
    c. the free base of a dyestuff whose halide salt is more intensely colored than the free base; and
    d. the normally solid amide of a halogenated aliphatic carboxylic acid that releases halide free radicals upon exposure to actinic light.

2. A composition according to claim 1 in which component a) is an acrylyl ester.

3. A composition according to claim 1 in which component a) has the formula $$CH_2=\overset{M}{C}-COOM' \text{ or } (CH_2=\overset{H}{C}-COO)_rG$$

where

M is H or Cl

M' is cycloalkyl of 5 to 12 carbon atoms, cycloalkenyl of 5 to 12 carbon atoms, or a radical of formula $C_pH_{2p}M''$ or $(C_qH_{2q}O)_s C_qH_{2q+1}$ where p is an integer from 1 to 10 q is an integer from 2 to 4 s is an integer from 0 to 4 and

M'' is hydrogen, hydroxyl, phenoxy or alkoxy of 1 to 8 carbon atoms;

G is polyvalent alkylene of formula

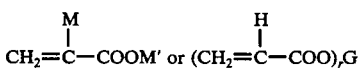

where x is an integer from 2 to 8 y is an integer from 0 to 2 or

G is a divalent ether or ester of formula $$-(C_qH_{2q}O)_t C_qH_{2q}- \text{ or}$$

$$-(C_qH_{2q}COO)_t C_qH_{2q}-$$

where t is an integer from 1 to 5 q is as previously defined and r is the valence of G and is 2 to 4.

4. A composition according to claim 1 in which component a) is selected from triethylene glycol diacrylate, tetraethylene glycol diacrylate, pentaerythritol triacrylate, trimethylol propane triacrylate, pentaerythritol tetraacrylate and mixtures thereof.

5. A composition according to claim 1 in which component (b) comprises at least one of an acyloin ether, an alkyl-substituted anthraquinone, benzophenone or an alkylaminobenzophenone.

6. A composition according to claim 1 in which component (c) is the free base of a ketone imine, an amino triarylmethane, an amino xanthene, an amino acridine or a methine or polymethine dyestuff.

7. A composition according to claim 6 in which component (c) is the free base of an amino triarylmethane dyestuff.

8. A composition according to claim 6 in which component (c) is the free base of an amino xanthene dyestuff.

9. A composition according to claim 6 in which component (c) is the free base of an amino acridine dyestuff.

10. A composition according to claim 6 in which component (c) is a methine or polymethine dyestuff.

11. A composition according to claim 6 in which component (c) is the free base of a Ketone-imine dyestuff.

12. A composition according to claim 1 in which component (d) has the formula

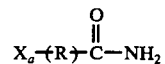

where

X is Cl, Br or I a is an integer from 1 to 4 r is alkylene to 1 to 6 carbon atoms or alkenylene of 2 to 6 carbon atoms.

13. A composition according to claim 12 in which R is methyl, ethyl, propyl, butyl, pentyl, hexyl, vinyl, allyl, isopentenyl butenyl, isobutenyl or pentenyl.

14. A composition according to claim 1 in which the normally solid amide melts between about 90° C. and 150° C.

15. A composition according to claim 1 in which the normally solid amide is acetamide, propionamide or butyramide that is substituted on a carbon atom by 1 to 3 of chloro, bromo or iodo.

16. A composition according to claim 1 in which component (d) is trichloroacetamide or tribromoacetamide.

17. A composition according to claim 1 in which component (d) is trichloroacetamide.

18. A stable photopolymerizable composition according to claim 1 which comprises a. an acrylyl ester
b. an acyloin ether, an alkyl-substituted anthraquinone, benzophenone or an alkylaminobenzophenone
c. the free base of an amino triarylmethane dyestuff, an amino xanthene dyestuff or an amino acridine dyestuff.
d. the normally solid amide of a halogenated aliphatic carboxylic acid that releases halide free radicals upon exposure to actinic light.

19. A stable photopolymerizable composition according to claim 1 which comprises
a. an acrylyl ester
b. an acyloin ether, an alkyl-substituted anthraquinone, benzophenone or an alkylaminobenzophenone,
c. the free base of an amino triarylmethane or an amino xanthene dyestuff
d. the normally solid amide of a halogenated aliphatic carboxylic acid, which melts between about 90° and 150° C.

20. A stable photopolymerizable composition according to claim 1 which comprises
a. triethylene glycol diacrylate, tetraethylene glycol diacrylate, pentaerythritol triacrylate, trimethylolpropane triacrylate, pentaerythritol tetraacrylate or mixture thereof,
b. an acyloin ether, an alkyl-substituted anthraquinone, benzophenone or an alkylaminobenzophenone,
c. the free base of an amino triarylmethane or of an amino xanthene dyestuff.
d. the normally solid amide of a halogenated aliphatic carboxylic acid that releases halide free radicals upon exposure to actinic light.

21. A composition according to claim 20 in which the dyestuff in Malachite Green Base (C.I. Solvent Green 1), Magenta Base (C.I. Solvent Red 41), Methyl Violet Base (C.I. Solvent Violet 8), Crystal Violet Base (C.I. Solvent Violet 9) or Rhodamine B Base (C.I. Solvent Red 49).

22. A composition according to claim 21 in which component d) is acetamide, propionamide or butyramide that is substituted on a carbon atom by one to three of Cl, Br, or I.

23. A composition according to claim 22 in which component d) is trichloroacetamide.

24. A dry photopolymerizable composition according to claim 18 in the form of a thin layer.

25. An assembly comprising a support sheet, a layer of a composition according to claim 18, one surface of which is adhered to the support sheet, and a transparent sheet adhered to the other surface of said composition.

26. A composition according to claim 18 on a support.

27. A composition according to claim 18 on a support comprising a conductive metal layer.

28. A composition according to claim 18 on a support comprising a conductive metal layer one surface of which is in contact with a coextensive surface of an insulating layer.

29. A process of polymerization which comprises imagewise exposing the composition of claim 18 to actinic radiation.

* * * * *

UNITED STATES PATENT OFFICE
CERTIFICATE OF CORRECTION

Patent No. 4,065,315                     Dated December 27, 1977

Inventor(s) Toshio Yamazaki, Harriet J. Cook, Melvin A. Lipson

It is certified that error appears in the above-identified patent and that said Letters Patent are hereby corrected as shown below:

Column 23, line 32, delete the word "thereof"

Signed and Sealed this

Eleventh Day of April 1978

[SEAL]

Attest:

RUTH C. MASON  
Attesting Officer

LUTRELLE F. PARKER  
Acting Commissioner of Patents and Trademarks